US010403328B2

(12) United States Patent
Albrecht et al.

(10) Patent No.: US 10,403,328 B2
(45) Date of Patent: Sep. 3, 2019

(54) ACOUSTIC ATTENUATION IN DATA STORAGE ENCLOSURES

(71) Applicant: HGST Netherlands B.V., Amsterdam (NL)

(72) Inventors: Thomas R. Albrecht, San Jose, CA (US); Darya Amin-Shahidi, San Jose, CA (US); Toshiki Hirano, San Jose, CA (US); Hussam Zebian, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/011,338

(22) Filed: Jan. 29, 2016

(65) Prior Publication Data

US 2017/0221526 A1    Aug. 3, 2017

(51) Int. Cl.
| | |
|---|---|
| *G11B 33/08* | (2006.01) |
| *G06F 1/18* | (2006.01) |
| *G11B 33/14* | (2006.01) |
| *H05K 7/20* | (2006.01) |

(52) U.S. Cl.
CPC .............. *G11B 33/08* (2013.01); *G06F 1/182* (2013.01); *G06F 1/187* (2013.01); *G11B 33/142* (2013.01); *G11B 33/144* (2013.01); *H05K 7/20736* (2013.01)

(58) Field of Classification Search
CPC ....... G11B 33/08; G11B 33/144; G06F 1/182; H05K 7/20736
See application file for complete search history.

(56) References Cited

U.S. PATENT DOCUMENTS

| 4,807,718 | A |   | 2/1989 | Lotz |
| 4,894,749 | A | * | 1/1990 | Elko ......................... G06F 1/20 165/104.33 |
| 5,544,012 | A | * | 8/1996 | Koike ................ H05K 7/20572 165/122 |

(Continued)

OTHER PUBLICATIONS

Daniel Keller, Keller Studio Acoustics and Soundproofing Basics, Nov. 10, 2011 [retrieved on Apr. 1, 2017]. Retrieved from the Internet: <URL: http://www.uaudio.com/blog/studio-acoustics-and-soundproofing-basics; 10 pages.

(Continued)

*Primary Examiner* — David M Sinclair
*Assistant Examiner* — Theron S Milliser

(57) ABSTRACT

To provide enhanced operation of data storage devices and systems, various systems and apparatuses are provided herein. In a first example, a data storage assembly includes an enclosure configured to house at least one data storage device and a fan assembly configured to provide airflow within the enclosure to ventilate the at least one data storage device. A plurality of acoustic waves emanate into the data storage device from one or more fans of the fan assembly during operation. An acoustic attenuation device is positioned within the enclosure and configured to deflect at least a first portion of the plurality of acoustic waves away from the at least one data storage device and absorb a portion of acoustic wave energy of at least a second portion of the plurality of acoustic waves.

20 Claims, 8 Drawing Sheets

(56) References Cited

U.S. PATENT DOCUMENTS

| | | | | |
|---|---|---|---|---|
| 5,963,425 A * | 10/1999 | Chrysler | | G06F 1/20 |
| | | | | 165/104.33 |
| 6,011,688 A * | 1/2000 | Thornburg | | G06F 1/20 |
| | | | | 165/80.3 |
| 6,104,608 A | 8/2000 | Catinelli et al. | | |
| 6,141,213 A * | 10/2000 | Antonuccio | | G06F 1/20 |
| | | | | 361/679.48 |
| 6,217,281 B1 * | 4/2001 | Jeng | | F04D 29/664 |
| | | | | 415/119 |
| 6,222,729 B1 * | 4/2001 | Yoshikawa | | H05K 7/20154 |
| | | | | 174/16.1 |
| 6,288,897 B1 * | 9/2001 | Fritschle | | G06F 1/20 |
| | | | | 165/122 |
| 6,343,984 B1 | 2/2002 | Langdon et al. | | |
| 6,459,579 B1 * | 10/2002 | Farmer | | H05K 7/20736 |
| | | | | 165/104.33 |
| 6,646,876 B2 | 11/2003 | Carr et al. | | |
| 6,745,149 B2 * | 6/2004 | Beeten | | H05K 7/20136 |
| | | | | 312/223.1 |
| 7,497,771 B2 * | 3/2009 | Choi | | F24F 1/0007 |
| | | | | 454/252 |
| 7,652,891 B2 * | 1/2010 | Lucero | | G06F 1/20 |
| | | | | 361/752 |
| 7,715,188 B2 | 5/2010 | Matsushima et al. | | |
| 7,762,373 B2 * | 7/2010 | Bolton | | F04D 29/665 |
| | | | | 181/202 |
| 7,894,613 B1 | 2/2011 | Ong et al. | | |
| 7,929,295 B2 * | 4/2011 | Joshi | | F04D 25/166 |
| | | | | 181/198 |
| 7,965,503 B2 | 6/2011 | Yoder et al. | | |
| 8,165,311 B2 | 4/2012 | Rodrigues et al. | | |
| 8,760,859 B2 * | 6/2014 | Fuchs | | G06F 1/1656 |
| | | | | 174/383 |
| 9,504,182 B2 * | 11/2016 | Olsson | | H02B 1/56 |
| 2001/0006453 A1 | 7/2001 | Glorioso et al. | | |
| 2001/0048571 A1 * | 12/2001 | Boutaghou | | G11B 33/08 |
| | | | | 360/97.19 |
| 2002/0051338 A1 | 5/2002 | Jiang et al. | | |
| 2002/0159232 A1 * | 10/2002 | Beitelmal | | H05K 7/20727 |
| | | | | 361/695 |
| 2005/0259393 A1 * | 11/2005 | Vinson | | H05K 7/20727 |
| | | | | 361/690 |
| 2006/0131101 A1 | 6/2006 | Crocker | | |
| 2006/0232930 A1 * | 10/2006 | Artman | | H05K 7/20736 |
| | | | | 361/695 |
| 2007/0110255 A1 * | 5/2007 | Barath | | G10K 11/1788 |
| | | | | 381/71.5 |
| 2007/0190920 A1 * | 8/2007 | Gilliland | | H05K 7/20736 |
| | | | | 454/184 |
| 2008/0065245 A1 * | 3/2008 | Tang | | H05K 7/20172 |
| | | | | 700/94 |
| 2008/0074841 A1 * | 3/2008 | Curtis | | G06F 1/20 |
| | | | | 361/695 |
| 2008/0211253 A1 * | 9/2008 | Gladfelter | | D21H 13/10 |
| | | | | 296/39.3 |
| 2008/0257639 A1 * | 10/2008 | Yamaguchi | | H05K 7/20736 |
| | | | | 181/198 |
| 2009/0016019 A1 * | 1/2009 | Bandholz | | H05K 7/20736 |
| | | | | 361/695 |
| 2010/0321874 A1 * | 12/2010 | Bhattacharyya | | H05K 7/20736 |
| | | | | 361/679.5 |
| 2011/0063795 A1 * | 3/2011 | Yeh | | G06F 1/182 |
| | | | | 361/679.48 |
| 2011/0175504 A1 * | 7/2011 | Cook | | H05K 7/20572 |
| | | | | 312/236 |
| 2011/0305878 A1 * | 12/2011 | Gladfelter | | B32B 3/30 |
| | | | | 428/195.1 |
| 2013/0277012 A1 * | 10/2013 | Cruz | | G06F 1/20 |
| | | | | 165/104.11 |
| 2015/0116923 A1 * | 4/2015 | Skirmont | | H05K 7/1492 |
| | | | | 361/679.31 |
| 2017/0131750 A1 * | 5/2017 | Sato | | G06F 1/20 |
| 2017/0160771 A1 * | 6/2017 | Albrecht | | G06F 1/181 |

OTHER PUBLICATIONS

PCT Application No. PCT/US2017/015150, Notification of Transmittal of the International Search Report and the Written Opinion of the International Searching Authority, or the Declaration, dated May 10, 2017, 13 pages.

* cited by examiner

ACOUSTIC ATTENUATION IN DATA STORAGE ENCLOSURES

TECHNICAL FIELD

Aspects of the disclosure are related to the field of data storage and attenuation of acoustics in data storage enclosures.

TECHNICAL BACKGROUND

Computer and network systems such as data storage systems, server systems, cloud storage systems, personal computers, and workstations, typically include data storage devices for storing and retrieving data. These data storage devices can include hard disk drives (HDDs), solid state storage drives (SSDs), tape storage devices, optical storage drives, hybrid storage devices that include both rotating and solid state data storage elements, and other mass storage devices.

As computer systems and networks grow in numbers and capability, there is a need for ever increasing storage capacity. Data centers, cloud computing facilities, and other at-scale data processing systems have further increased the need for digital data storage systems capable of transferring and holding immense amounts of data. Data centers can house this large quantity of data storage devices in various rack-mounted and high-density storage configurations.

One approach to providing sufficient data storage in data centers is the use of arrays of independent data storage devices. Many data storage devices can be held in an electronics enclosure. An electronics enclosure is a modular unit that can hold and operate independent data storage devices in an array, computer processors, routers and other electronic equipment. The data storage devices are held and operated in close proximity within the electronics enclosure, so that many data storage devices can be fit into a defined volume. Operating many data storage devices within close proximity within the electronics enclosure can create heat issues and lead to premature failure of the data storage devices.

Electronics enclosures typically include fans or other cooling devices. If a fan fails in an electronics enclosure having two or more fans, the failed fan becomes the pathway of least resistance for airflow and diverts cooling airflow away from the data storage devices. Some electronics enclosures include assemblies with hinged louvers that attach to the exhaust-side of the fan. When a fan fails, the louvers close under the force gravity or an active servo mechanism and prevent backflow through the failing fan. These louver assemblies are typically mounted external to the data storage assemblies or electronics enclosures to maximize usage of interior space for electronics components. Externally mounted backflow louvers add bulk to the enclosure and can interfere with cables, power cords, and walls near to the enclosure. Furthermore, louvered designs include many moving parts, which can lead to reduced reliability of electronics enclosures.

While densities and workloads for the data storage devices increase, individual data enclosures can experience increased failure rates due to the increased densities and higher operating temperatures. Moreover, tight packing of data storage devices within enclosures, such as within rack-mount modular units, can lead to harsher vibrational and thermal environments for data storage devices. These harsh environments, such as due to fan mechanical vibrations, acoustic disturbance, flow induced disturbance, or other acoustic disturbances, can affect reliability and readability of data storage devices that incorporate rotating magnetic media. In systems with dozens of hard drives and fans for cooling, the fans can cause vibration disturbances during reading and writing in the hard drives with hard drives closest to the fans most affected by the fan noise.

Overview

To provide enhanced operation of data storage devices and systems, various systems and apparatuses are provided herein. In a first example, a data storage assembly includes an enclosure configured to house at least one data storage device and a fan assembly configured to provide airflow within the enclosure to ventilate the at least one data storage device. A plurality of acoustic waves emanate into the data storage device from one or more fans of the fan assembly during operation. An acoustic attenuation device positioned within the enclosure and configured to deflect at least a first portion of the plurality of acoustic waves away from the at least one data storage device and absorb a portion of acoustic wave energy of at least a second portion of the plurality of acoustic waves.

In another example, a data storage system includes a chassis having a data storage device space defined therein to house a data storage device, the chassis having a first opening on a first side and a second opening on a second side opposite the first side. A fan assembly coupled to the housing and configured to cause an airflow to pass through the chassis from the first side to the second side and around the data storage device to cool the data storage device. An acoustic attenuation device enclosed within the chassis and configured to redirect a first portion of a first plurality of acoustic waves generated by the fan assembly away from the data storage device space and to absorb acoustic wave energy of a second portion of the first plurality of acoustic waves.

In another example, a data storage system includes a data storage device and a housing enclosing the data storage device. The housing has a first opening on a first side and a second opening on a second side opposite the first side. A fan assembly is coupled to the housing and configured to draw an airflow through the enclosure from the first side to the second side. The data storage device impedes the airflow through the housing by a first flow impedance value. An acoustic attenuation device is also enclosed within the enclosure between the data storage device and the fan assembly, the acoustic attenuation device comprising a plurality of surface contours configured to redirect a first plurality of acoustic waves generated by the fan assembly away from the data storage device. The acoustic attenuation device impedes the airflow through the housing by a second flow impedance value. The second flow impedance value is less than the first flow impedance value.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

DETAILED DESCRIPTION

Data storage devices, such as hard disk drives (HDDs), solid state drives (SSDs), and hybrid disk drives that have both rotating and solid state storage elements, can be included in various arrayed configurations, such as rack-mounted modular enclosures, which house dozens of individual drives. Cooling or ventilation fans can be included with the enclosures to direct airflow over the various drives. Power supply equipment can also be included to provide power to the various storage devices, to convert input power from a utility or building infrastructure to a form usable by the storage devices.

Drives, which incorporate rotating media, such as rotating magnetic media of hard disk drives or hybrid disk drives, among others, also include various electromechanical elements to position read/write heads over the spinning media. These electromechanical elements include armatures, motors, actuators, voice coils, servos, or other elements, which can be affected by vibration of the drive elements themselves or by vibrational environment in which the drives are included. This vibrational environment can include vibrations or acoustic disturbances introduced by the ventilation fans, as well as the drives themselves. For example, a drive, which performs many random read/write operations, can induce more vibration into the surrounding environment of that drive due to rapid movements of the associated electromechanical elements within the drive. Other components within a storage enclosure, such as fans, can also affect the vibration levels within an associated enclosure. The examples herein discuss various systems, software, devices, and methods to alter the vibrational disturbance environment of a storage enclosure. Specifically, speeds and phase relationships among ventilation fans can be altered to reduce acoustic disturbances to the data storage devices in an enclosure.

Figure 1:
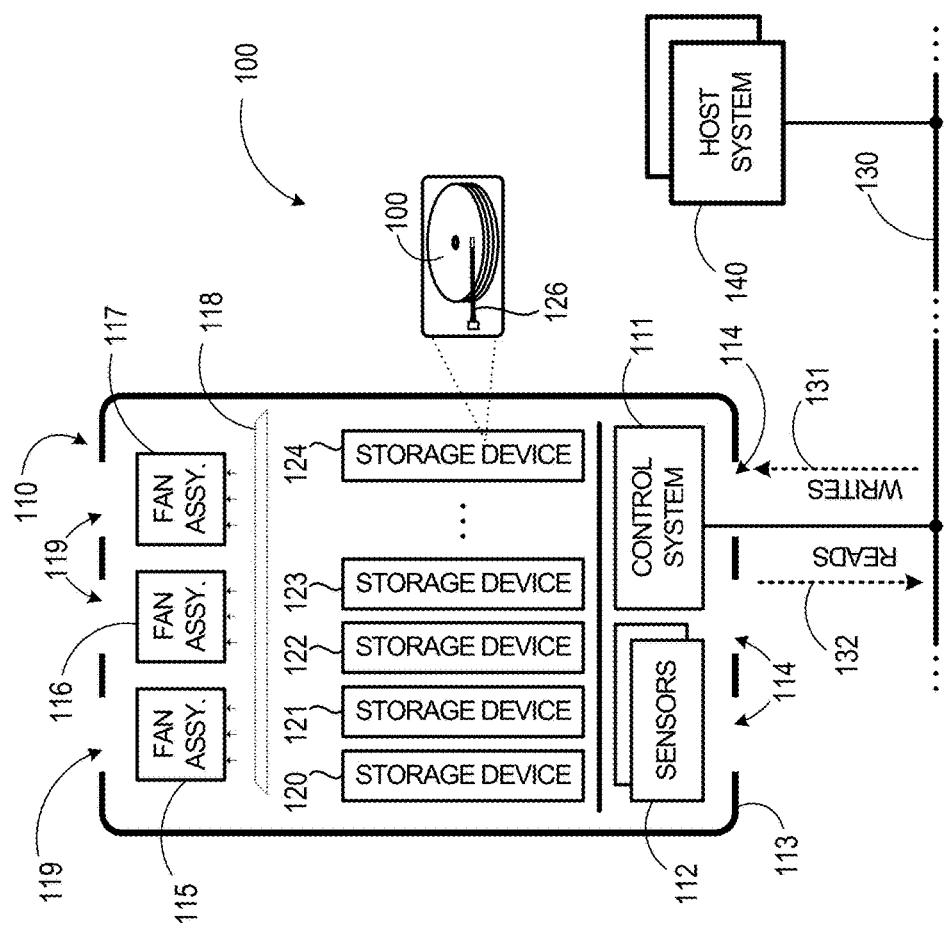
FIG. 1 is a system diagram illustrating a data system.

As a first example of a data storage system, FIG. 1 is presented. FIG. 1 is a system diagram illustrating system 100. System 100 includes data storage system 110 and one or more host systems 140. Data storage system 110 and host system 140 communicate over storage link 130. Data storage system 110 can be included in an environment that includes one or more data storage arrays, such as a rack-mount computing environment.

In FIG. 1, data storage system 110 comprises an assembly that includes control system 111, sensors 112, chassis or enclosure 113, a plurality of fan assemblies 115-117, an acoustic attenuator system 118, and a plurality of data storage devices 120-124. Each of data storage devices 120-124 can include one or more rotating storage media, such as shown in the detailed view for data storage device 124 as including rotating media 125 and read/write heads/armature assembly 126. In some examples, ones of data storage devices 120-124 include solid state storage media, and may omit rotating media, or can include combinations of rotating and solid state storage media.

Control system 111 is communicatively coupled to data storage devices 120-124 and sensors 112. Although control system 111 is shown as internal to data storage system 110 in this example, it should be understood that in other examples control system 111 can be included in other elements external to data storage system 110. Furthermore, elements of control system 111 can be included in individual ones of data storage devices 120-124.

In operation, data storage system 110 receives read or write transactions over storage link 130 issued by host system 140, such as write operations 131 and read operations 132. Responsive to read operations, individual data storage devices in data storage system 110 can retrieve data stored upon associated storage media for transfer to host system 140. Responsive to write operations, individual data storage devices in data storage system 110 store data on the associated storage media. It should be understood that other components of data storage system 110 and data storage devices 120-124 are omitted for clarity in FIG. 1, such as transaction queues, chassis, interconnect, read/write heads, media, armatures, preamps, transceivers, processors, amplifiers, motors, servos, enclosures, and other electrical and mechanical elements.

Data storage system 110 comprises a plurality of data storage devices 120-124. These data storage devices are coupled to control system 111 by one or more storage links, which can comprise a serial ATA interface, Serial Attached Small Computer System (SAS) interface, Integrated Drive Electronics (IDE) interface, Non-Volatile Memory Express (NVMe) interface, ATA interface, Peripheral Component Interconnect Express (PCIe) interface, Universal Serial Bus (USB) interface, wireless interface, Direct Media Interface (DMI), Ethernet interface, networking interface, or other communication and data interface, including combinations, variations, and improvements thereof. Data storage system 110 can also comprise cache systems, chassis, enclosure 113, fan assemblies 115-117, interconnect, cabling, or other circuitry and equipment.

Control system 111 includes processing circuitry, communication interfaces, and one or more non-transitory computer-readable storage devices. The processing circuitry can comprise one or more microprocessors and other circuitry that retrieves and executes firmware from memory for operating as discussed herein. The processing circuitry can be implemented within a single processing device but can also be distributed across multiple processing devices or sub-systems that cooperate in executing program instructions. Examples of the processing circuitry include general purpose central processing units, application specific processors, and logic devices, as well as any other type of processing device, combinations, or variations thereof. The communication interfaces can include one or more storage interfaces for communicating with host systems, networks, and the like. The communication systems can include transceivers, interface circuitry, connectors, buffers, microcontrollers, and other interface equipment.

Sensors 112 can include analog or digital vibration sensors or acoustic disturbance sensors configured to detect vibration or acoustic disturbance in enclosure 113, near any of data storage devices 120-124, or associated with other elements of data storage system 110, such as fan assemblies 115-117. Vibration sensors can include accelerometers, gyroscopic sensors, microphones, acoustic sensors, or other vibration sensors. Sensors 112 can also detect failures of various components of data storage system 110, such as failure of power supplies, fans, data storage devices, and the like, which can affect the vibrational environment of data storage system 110. Sensors 112 can also include various interfaces for communicating measured information, such as to control system 111. These interfaces can include transceivers, analog-to-digital conversion elements, amplifiers, filters, signal processors, among other elements. In some examples, sensors 112 can each include microcontroller elements, programmable logic, or discrete logic to control the operations of sensors 112. In some examples, data storage devices 120-124 each can include ones of sensors 112, and data storage devices 120-124 can include equipment and circuitry to transfer sensor information over an associated storage or host interface to control system 111.

Enclosure 113 comprises structural elements to house and structurally support the elements of data storage system 110. Enclosure 113 can include chassis elements, frames, fastening elements, rackmount features, ventilation features, among other elements. In many examples, enclosure 113 also includes fans 1115-117 or other cooling and ventilation elements for providing airflow to the elements of data storage system 110.

Fan assemblies 115-117 provide airflow to elements within enclosure 113, such as the elements of data storage system 110. Airflow is created as air is drawn through one or more openings 114 in one end of enclosure 113 and forced through one or more openings 119 in another, opposite end of enclosure 113. Fan assemblies 115-117 can comprise any fan type, such as axial-flow, centrifugal and cross-flow, or other fan types, including associated ducts, louvers, fins, or other directional elements, including combinations and variations thereof.

Data storage system 110 also includes one or more power supplies to convert external input power sources or provide various forms of electrical energy to the elements of data storage system 110. Power supplies can each comprise power conversion elements, power electronics, transformers, voltage conversion circuitry, among other elements. Power supplies can also be included in an assembly with one or more ventilation fans, such as fan assemblies 115-117, to provide cooling and ventilation to the power supplies and to other components in enclosure 113.

Each of data storage devices 120-124 includes one or more computer readable storage media accessible via one or more read/write heads and associated electromechanical elements. In FIG. 1, an example detailed view of data storage device 124 is shown to highlight rotating media 125 and read/write heads and armature assembly 126, and these elements can be included in each of data storage devices 120-124, although variations are possible among the data storage devices, such as when solid state media are employed. Data storage devices 120-124 can also each include processing circuitry, communication interfaces, armatures, preamps, transceivers, processors, amplifiers, motors, servos, enclosures, and other electrical and mechanical elements. Data storage devices 120-124 can each comprise a hard disk drive, hybrid disk drive, solid state drive, or other computer readable storage device, including combinations thereof. Data storage devices 120-124 can each include further elements that can comprise similar elements as sensors 112. The computer readable storage media of data storage devices 120-124 can each include rotating magnetic storage media, but can additionally include other media, such as solid state drive elements, caches, or cache systems. These other media can include solid state storage media, optical storage media, non-rotating magnetic media, phase change magnetic media, spin-based storage media, or other storage media, including combinations, variations, and improvements thereof. In some examples, data storage devices 120-124 each comprise a hybrid hard drive employing solid state storage elements in addition to rotating magnetic storage media. Associated storage media can employ various magnetic storage schemes, such as random write techniques, shingled magnetic recording (SMR), perpendicular magnetic recording (PMR), or heat-assisted magnetic recording (HAMR), including combinations, variations, and improvements thereof.

Host system 140 can include processing elements, data transfer elements, and user interface elements. In some examples host system 140 is a central processing unit of a computing device or computing system. In other examples, host system 140 also includes memory elements, data storage and transfer elements, controller elements, logic elements, firmware, execution elements, and other processing system components. In yet other examples, host system 140 comprises a RAID controller processor or storage system central processor, such as a microprocessor, microcontroller, Field Programmable Gate Array (FPGA), or other processing and logic device, including combinations thereof. Host system 140 can include, or interface with, user interface elements, which can allow a user of data system 100 to control the operations of data system 100 or to monitor the status or operations of data system 100. These user interface elements can include graphical or text displays, indicator lights, network interfaces, web interfaces, software interfaces, user input devices, or other user interface elements. Host system 140 can also include interface circuitry and elements for handling communications over bus 130, such as logic, processing portions, buffers, transceivers, and the like.

Bus 130 can include one or more serial or parallel data links, such as a Peripheral Component Interconnect Express (PCIe) interface, serial ATA interface, Serial Attached Small Computer System (SAS) interface, Integrated Drive Electronics (IDE) interface, ATA interface, Universal Serial Bus (USB) interface, wireless interface, Direct Media Interface (DMI), Ethernet interface, networking interface, or other communication and data interface, including combinations, variations, and improvements thereof. Although one bus 130 is shown in FIG. 1, it should be understood that one or more discrete links can be employed between the elements of data system 100.

Closely positioning the data storage devices 120-124 within the enclosure 113 increases the heat load and tends to make heat extraction more difficult. As such, strong cooling fans 115-117 are used to force enough air through the limited flow area. This typically results on large acoustic disturbances in addition to the disturbances due to neighboring drives performing seek functions. Such acoustic disturbance on the data storage devices 120-124 positioned close to cooling fans 115-117 in enclosure 113 can be great enough to significantly degrade the performance of those drives.

Figure 2:
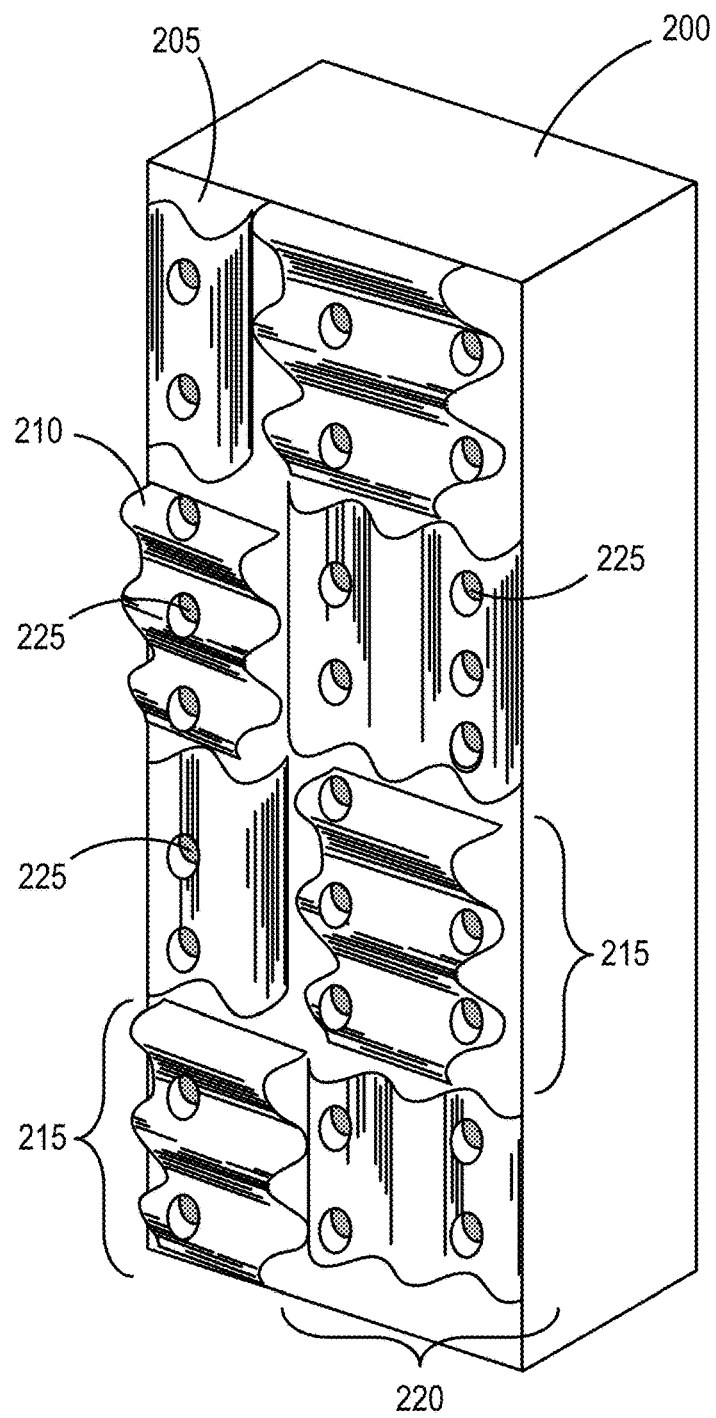
FIG. 2 illustrates an acoustic attenuation device.

FIG. 2 illustrates an example of an acoustic attenuator 200 of the acoustic attenuator system 118 of FIG. 1. Acoustic attenuator 200 comprises one or more acoustically attenuating or dampening materials that can alter acoustic properties associated with fan assemblies 115-117 to reduce negative acoustic effects on the storage devices 120-124. Acoustic attenuator 200 accomplishes acoustic effect reduction at least through a dampening or absorption of acoustic energy over a range of frequencies as well as through a redirection or deflection of the acoustic waves.

The material or material composition of acoustic attenuator 200 is designed to dampen or absorb acoustic waves within the material of the attenuator. Acoustic attenuator 200 can comprise foams, polymers, metal foams, glass fibers, cellulose, baffles, resonant chambers, or other materials and elements that absorb or trap acoustic waves at disturbance frequencies. Examples of the material composition of the acoustic attenuator layers include: closed cell polymeric foam material; open-cell polymeric foam material; fiber board or cardboard, which has a high density but is soft and lossy; corrugated paper, which has a low density and is lossy by virtue of its structure; corrugated plastic; elastomer; woven or pressed textile; fiber; molded paper-pulp such as egg-carton and packaging corner blocks; and combinations of these materials.

With a material such as foam, which can have a density to comparable to that of air, a portion of the acoustic wave enters the material, and the rest is deflected. The foam dissipates some of the energy of the portion that travels through it. Multiple deflections and absorption of the energy by the foam result in attenuation of the acoustic waves.

The material of acoustic attenuator 200 typically has one or more attenuation frequencies or frequency ranges over which acoustic waves are attenuated or reduced. In a further example, acoustic attenuator 200 can include metamaterials that can be selectively tuned though microstructures to dampen certain selected acoustic frequencies.

In addition to dampening acoustic waves within the material itself, the outer surface 205 of the acoustic attenuator 200 may include contours or other texturing 210 designed to deflect and scatter the acoustic waves in directions away from the storage devices 120-124. In this manner, the waves are deflected before they can reach the storage devices 120-124. In a preferable embodiment, the texturing 210 of the attenuator surface 205 maximizes acoustic wave scattering to minimize the amount of acoustic waves that have a direct line of propagation toward the storage devices 120-124. The texturing 210 preferably causes an acoustic wave to be deflected or redirected multiple times away from the acoustic attenuator 200 before being able to pass into the acoustic dampening material. Every time acoustic waves are deflected at an interface, a portion of their energy passes through the interface and is partially absorbed. As a result, the deflected wave energy can be lower than the incident wave's energy. Therefore, multiple deflections on acoustic damping materials can attenuate acoustic disturbance. Typically, lower density and lossy material such as open-cell acoustic foam can provide best absorption and attenuation.

As illustrated in FIG. 2, texture 210 of surface 205 includes surface undulations designed to deflect acoustic waves away from surface 205. In this embodiment, texture 210 includes horizontal groups 215 of three undulations and vertical groups 220 of three undulations. The alternating pattern of horizontal and vertical groups 215, 220 helps to maximize the redirection of acoustic waves impinging texture 210 away from surface 205. The texturing can also help with impedance matching of the interface and improving the acoustic wave absorption.

As described above, fan assemblies 115-117 provide airflow to elements within enclosure 113. While reducing their acoustic effects on the storage devices 120-124 is desirable, their ability to provide cooling to storage devices 120-124 also needs to be maintained. Accordingly, acoustic attenuator 200 also includes passages or holes 225 that allow cooling air to flow therethrough.

Figure 3:
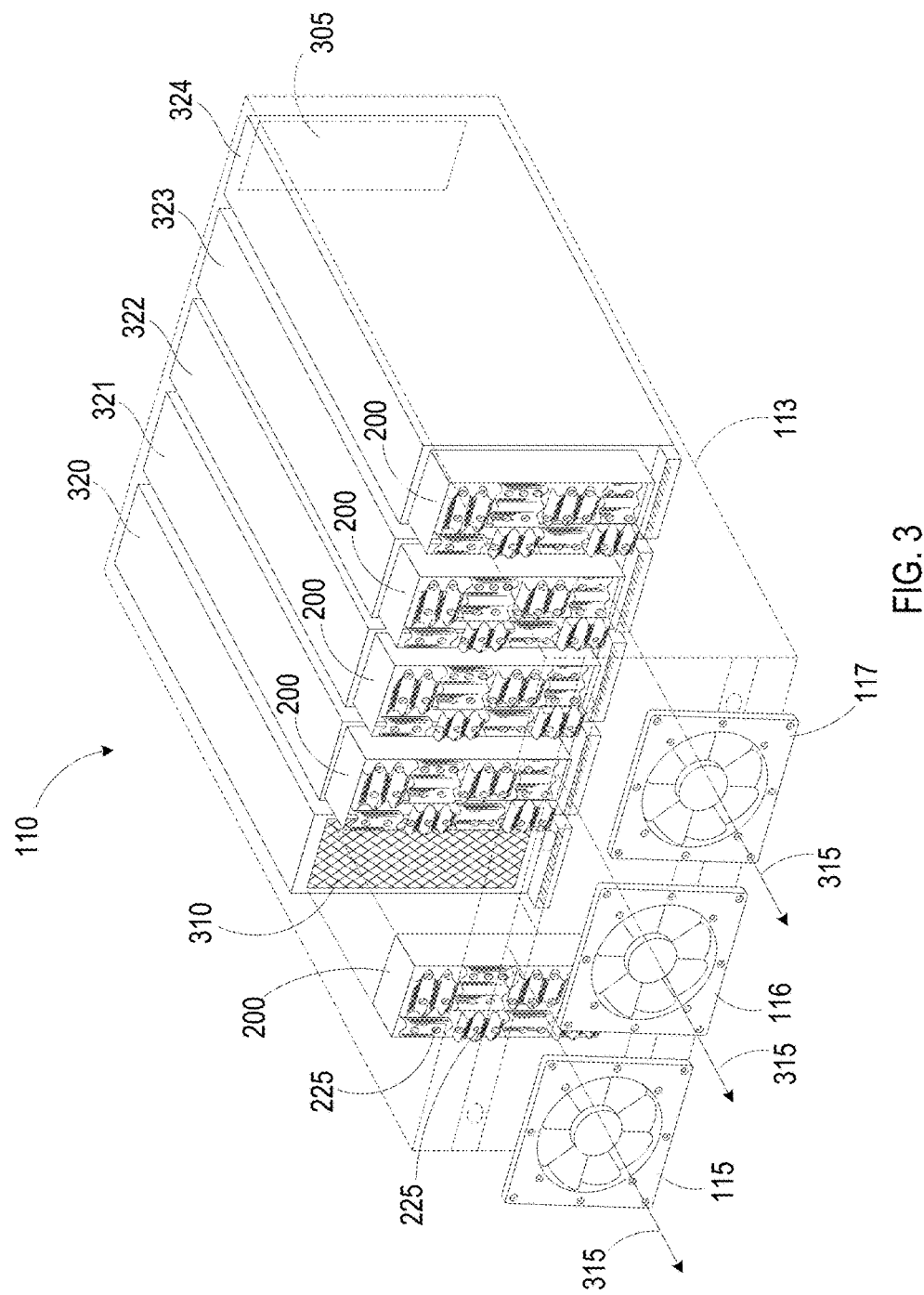
FIG. 3 illustrates an electronics enclosure incorporating the acoustic attenuation device of FIG. 2.

Referring to FIG. 3, data storage system 110 with acoustic reduction is shown. FIG. 3 illustrates a plurality of sleds 320-324 respectively enclosing storage devices 120-124 therein. Each sled includes an opening 305 on a first side facing away from fans 115-117 and another opening 310 on a second side facing fans 115-117. When fans 115-117 are operating air is drawn through openings 305 and 310 of sleds 320-324 in the general direction of airflow 315 through enclosure 113.

Acoustic noise from fans 115-117 that propagates through enclosure 113 toward sleds 320-324 is attenuated by attenuators 200 as described above. As shown, a separate acoustic attenuator 200 is attached to the end of each sled 320-324 near respective openings 310 to attenuate or prevent the fan noise from reaching the storage devices 120-124. To allow the airflow to continue to flow through enclosure 113, holes 225 in the attenuators 200 are sized and spaced to provide as minimal of an effect on airflow as possible while yet allowing the attenuator 200 to providing heightened acoustic attenuation.

In a preferred embodiment, the combined cross-section area of the holes 225 in each acoustic attenuator 200 prevents an increase in the airflow impedance through the data storage system 110, and the cross-section of each hole 225 is small enough to allow the acoustic attenuators 200 to attenuate most of the acoustic waves generated by fans 115-117. In addition, the effect of dust clogging that can happen in small hole diameters is taken into account in sizing the diameters of holes 225. If the diameters are individually too small, dust can be collected in the holes 225, and partial or total blocking of air passage therethrough can occur, which can lead to a reduction in the amount of cooling air that can cool the system 110.

While FIG. 3 illustrates an embodiment of separate acoustic attenuators 200 coupled to individual sleds 320-324, alternative embodiments are also contemplated. For example, rather than having an individual attenuator 200 for each sled 320-324, a single, large attenuator crossing the width of enclosure 113 between sleds 320-324 and fans 115-117 may be incorporated.

Figure 4:
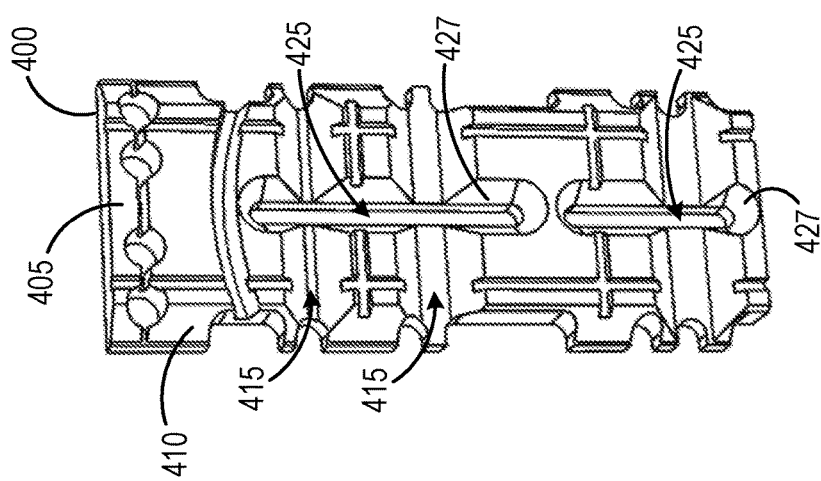
FIG. 4 illustrates an acoustic attenuation device.

FIG. 4 illustrates an acoustic attenuator 400 according to another embodiment. Acoustic attenuator 400 has some similarities with acoustic attenuator 200 above. For example, acoustic attenuator 400 is also designed to dampen or absorb acoustic waves within the material of the attenuator. Acoustic attenuator 400 may also be constructed of the same materials as described above such as, for example, an open-cell foam for a high level of acoustic wave absorption and attenuation.

Acoustic attenuator 400 is illustrated with a different texture 410 or contouring of its surface 405. To increase a cross-flow within the enclosure, surface 405 may have one or more crosscuts 415 formed therein that reduce a resistance to the cross-flow in the air space inside the enclosure between the fan assembly (e.g., fans 115-117 of FIG. 1) and the acoustic attenuation devices 400. In addition, some or all of the passages or holes 425 may be formed adjacently to a respective angled opening 427 designed to lower an airflow resistance of acoustic attenuator 400 and to provide a smoother flow profile therethrough. The contour 410 of surface 405 is preferably designed to maximize a volume of the attenuator while trying to minimize the impact of the impedance of the attenuator to the airflow.

Figure 5:
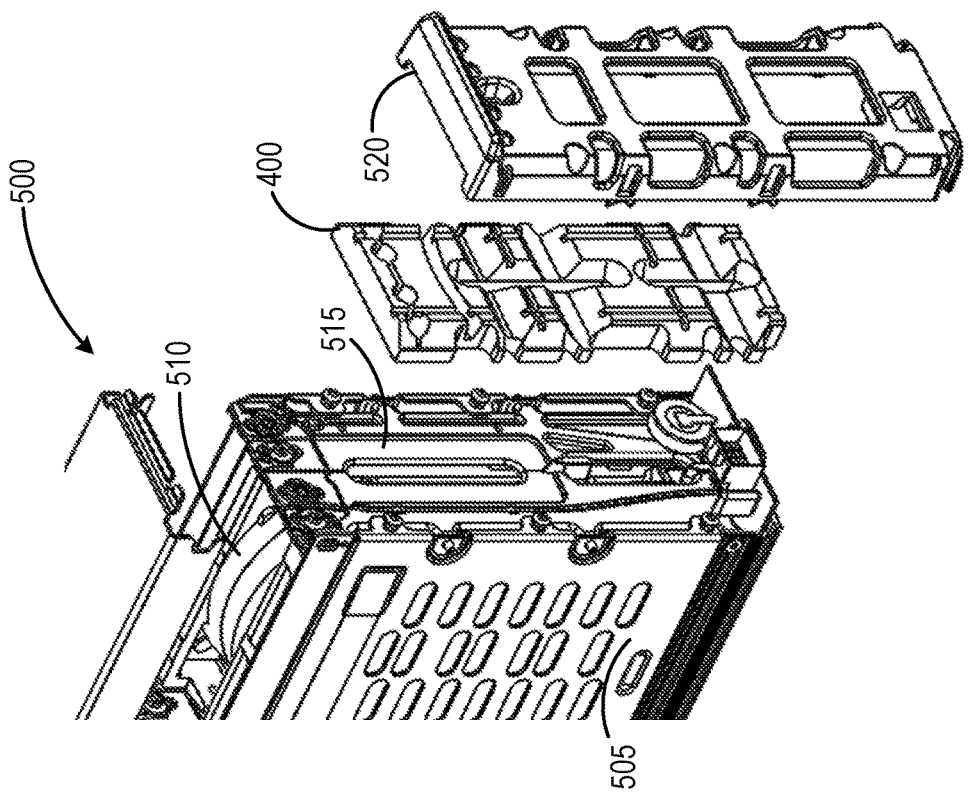
FIG. 5 illustrates an exploded view of a data storage device sled assembly incorporating the acoustic attenuation device of FIG. 4.

FIG. 5 illustrates an exploded view of a placement of acoustic attenuator 400 adjacent to a sled assembly 500. Sled assembly 500 includes a sled enclosure 505 with a storage device 510 housed inside. Acoustic attenuator 400 is positioned between a sled divider 515 and a rear bezel 520 of enclosure 505. In an embodiment where the sled enclosure 505 does not have a rear bezel 520, acoustic attenuator 400 may be coupled to sled assembly 500 via adhesive, for example.

Figure 6:
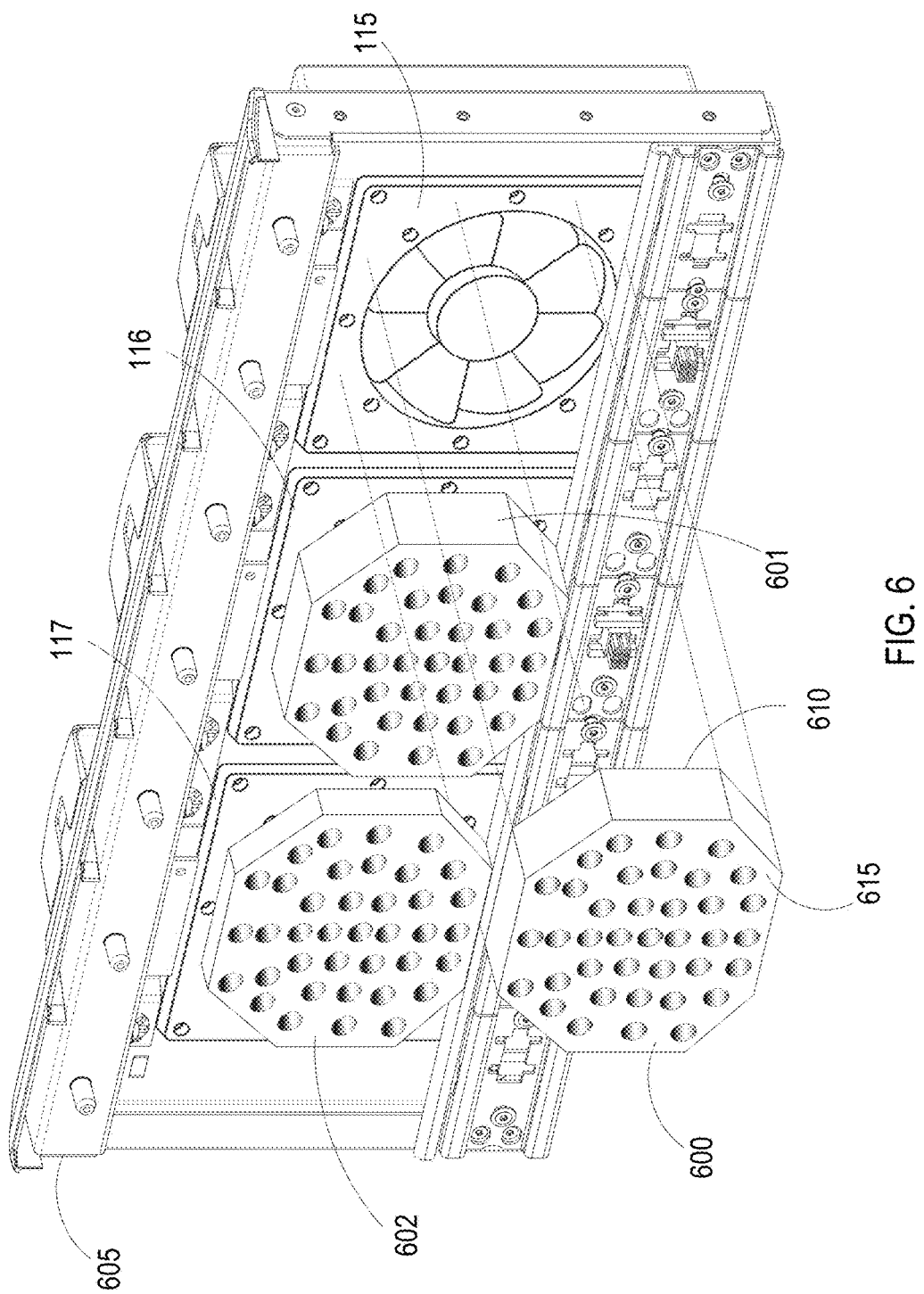
FIG. 6 illustrates an acoustic attenuation device incorporated into an electronics enclosure.

In addition, as illustrated in FIG. 6, individual acoustic attenuators 600-602 may be respectively coupled to each fan 115-117 rather than to storage device sleds 320-324. FIG. 6 illustrates a portion of enclosure 113 showing a bulkhead 605 to which fans 115-117 are coupled. A back or rear surface 610 of attenuators 600-602 is shown. A front surface 610 of attenuators 600-602 facing fans 115-117 is designed to have contours to redirect or deflect acoustic waves back toward fans 115-117 as described above. While rear surface 615 is shown to be planar, surface contours such as contours 210 may be incorporated therein. However, since the rear surface 615 faces away from the source of the noise, such additional texturing provides a reduced effect of noise scattering.

FIG. 6 also shows that the thickness of acoustic attenuator 602 is different from the thicknesses of attenuators 600-601. In addition to designing the material, hole spacing, shape, and surface texturing of the attenuator to achieve desired attenuation properties, the thickness also contributes to the airflow and acoustic wave attenuation properties of the attenuator. In general, the thicker the attenuator, the greater its ability to attenuate becomes. However, thicker attenuators also take up more room or space within the enclosure 113 and can affect cross-flow of the cooling air within the enclosure 113. Thicker attenuators also tend to have a larger airflow resistance value, causing overall system flow impedance to be affected. It is sometimes less desirable or even not possible to grow the space within an enclosure to account for the addition of acoustic attenuators. Accordingly, available space within the enclosure is often an important factor when designing acoustic attenuators according to embodiments of the design. While FIG. 6 shows acoustic attenuators of different thicknesses within the same system to illustrate different thickness designs, the acoustic attenuators in a same system may have all design properties (e.g., material, hole spacing, shape, surface texturing, etc.) in common with each other or may each have design properties separate and distinct from each other.

Figure 7:
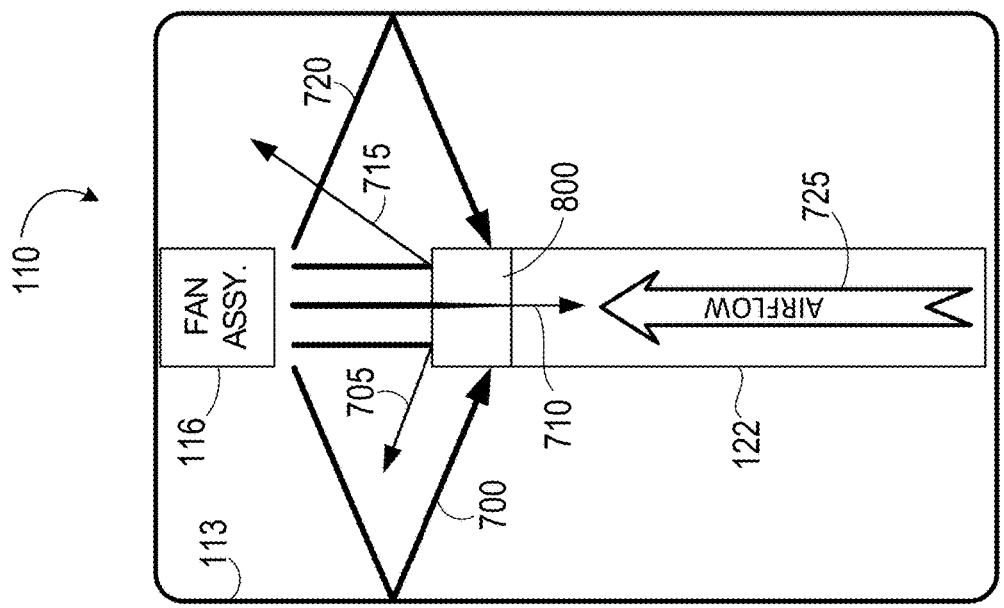
FIG. 7 illustrates a schematic diagram of a data system without acoustic attenuation.
Figure 8:
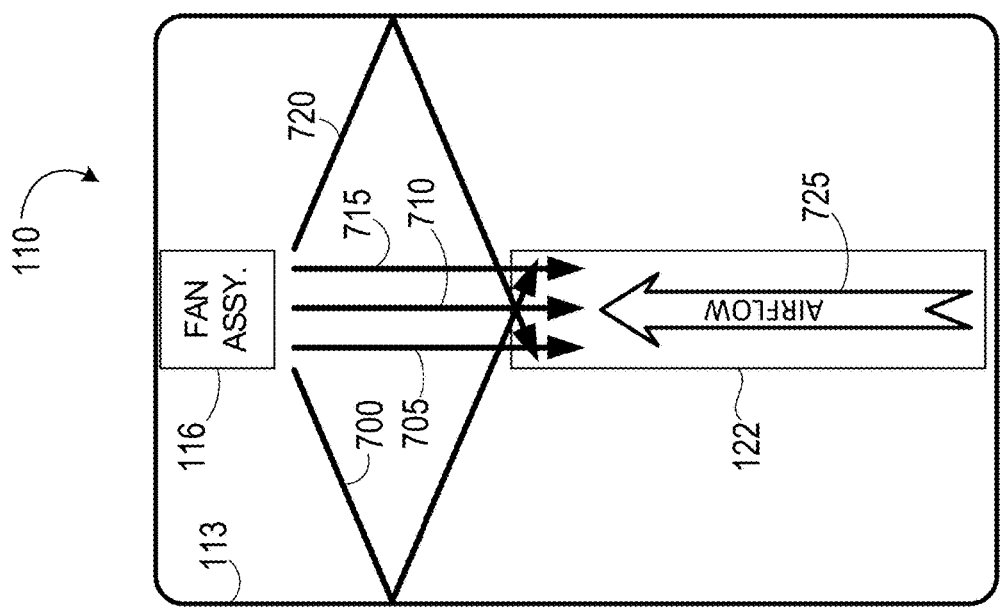
FIG. 8 illustrates a schematic diagram of a data system with acoustic attenuation.

FIGS. 7 and 8 illustrate simplified schematic diagrams of data storage system 110. In FIG. 7, acoustic waves 700-720 are shown emanating from fan assembly 116. Acoustic waves 700, 720 are shown rebounding or deflecting off of enclosure 113 and impinging on storage device 122. Acoustic waves 705-715 are shown directly impinging on storage device 122 without being deflected off of other surfaces. Acoustic waves 700-720 are merely examples, and other acoustic waves having paths other than that shown in FIGS. 7 and 8 may exist within enclosure 113. The data storage system 110 shown in FIG. 7 does not include an acoustic device as described herein for reducing or eliminating the acoustic waves emanating from fan assembly 116. As such, acoustic waves 700-720 are able to penetrate into storage device 122 and may cause a detriment to the operation and reliability of storage device 122 as described above.

FIG. 8 illustrates a schematic diagram shown in FIG. 7 with the addition of an acoustic device 800 configured as described herein. Acoustic device 800 is shown to provide a barrier for entry of acoustic waves 700, 720 into storage device 122. That is, acoustic waves 700, 720 are completely absorbed within acoustic device 800. Acoustic waves 705, 715 are redirected or deflected away from storage device 122 before they impinge thereon. Acoustic device 800 partially absorbs and attenuates acoustic waves 705, 715 such that their reflected energy is lessened.

Acoustic device 800 may not be able to completely eliminate all acoustic waves from reaching storage device 122. Accordingly, some acoustic wave interference may penetrate into storage device 122. Acoustic wave 710, for example, may be able to pass through acoustic device 800 and into storage device 122. However, as shown, acoustic device 800 is configured to reduce the intensity or strength of acoustic wave 710 such that its impact on storage device 122 is lessened.

FIGS. 7 and 8 show airflow 725 passing through data storage system 110. As illustrated in FIG. 7, operation of the fan assembly 116 causes airflow 725 to pass through data storage system 110 to ventilate the components therein such as storage device 122. The components within data storage system 110 have an airflow impedance that impedes or reduces a strength of airflow 725 as it is drawn through the enclosure 113. As illustrated in FIG. 7, the strength of airflow 725 through the enclosure 113 is not significantly reduced via the addition of acoustic device 800 into the data storage system 110. The airflow resistance or impedance of the holes (such as holes 225 shown in FIG. 3) of acoustic device 800 is less than the airflow resistance or impedance of the components of data storage system 110 without acoustic device 800; thus, the strength of airflow 725 is maintained when acoustic device 800 is placed within the system 110.

Figure 9:
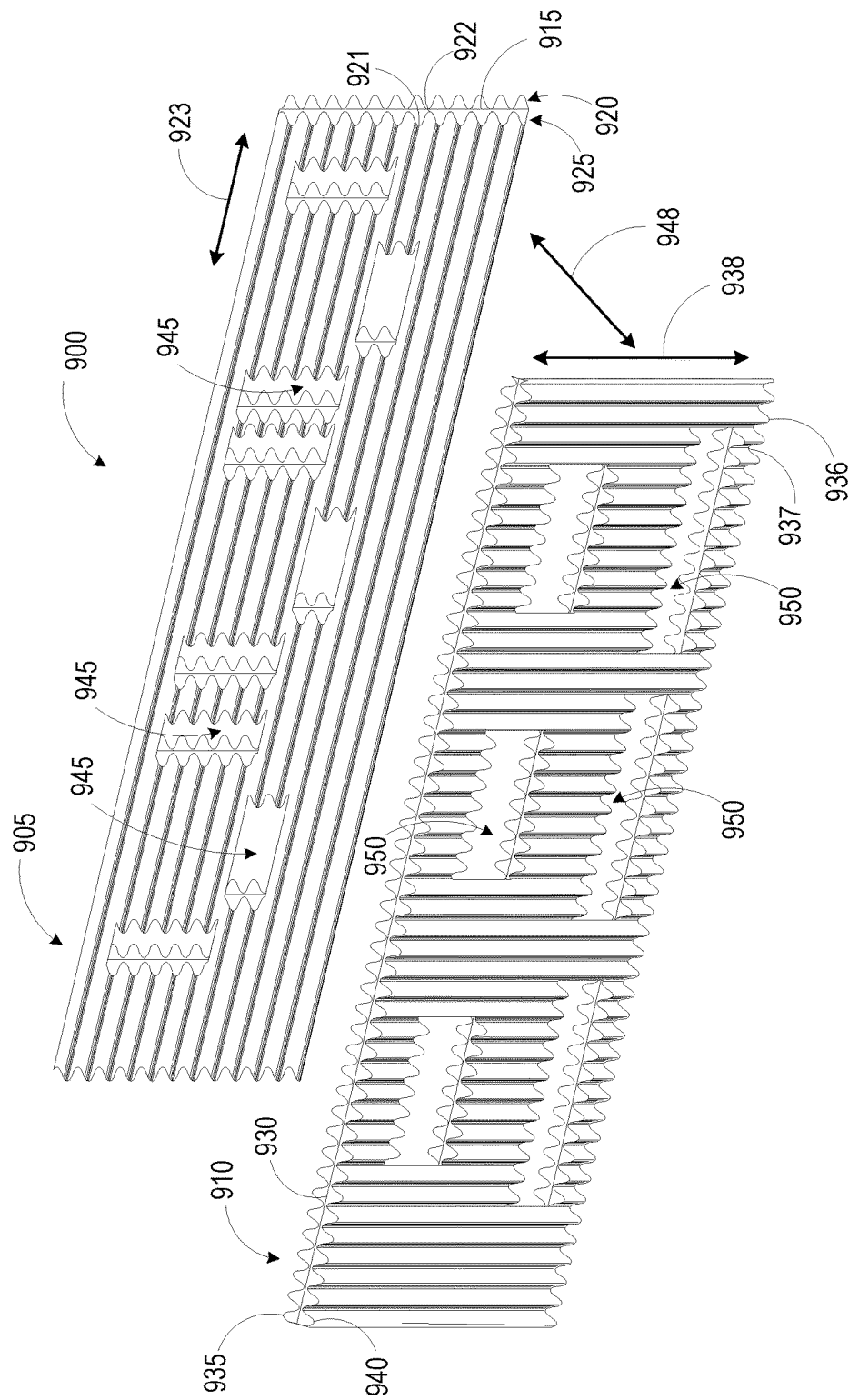
FIG. 9 illustrates an acoustic attenuation device.

FIG. 9 illustrates an example of an acoustic attenuator 900 of the acoustic attenuator system 118 of FIG. 1 according to another embodiment. Like acoustic attenuator 200, acoustic attenuator 900 comprises one or more acoustically active materials that can alter acoustic properties associated with fan assemblies 115-117 to reduce negative acoustic effects on the storage devices 120-124. Acoustic attenuator 900 accomplishes acoustic effect reduction at least through a dampening or absorption of acoustic frequencies as well as through a redirection or deflection of the acoustic frequencies or waves.

Attenuator 900 includes a first attenuator 905 and a second attenuator 910. In one embodiment, first attenuator 905 is made of a cardboard sheet 915 having first and second corrugated sheets 920, 925 on either side. Second attenuator 910 is made of a cardboard sheet 930 having first and second corrugated sheets 935, 940 on either side. In a preferred embodiment, first and second attenuators 905, 910 are die-cut sheets. The cardboard material of first and second attenuators 905, 910 helps to absorb acoustic waves. However, other acoustic wave absorption materials such as those described above are also contemplated herein. In another embodiment, first and second attenuators 905, 910 are made of just a single respective corrugated sheet. Furthermore, in other embodiments, additional layers of flat and corrugated sheets may be added to that shown for each attenuator 905, 910.

As shown, corrugated sheets 920, 925 have horizontal corrugation surfaces, and corrugated sheets 935, 940 have vertical corrugation surfaces. The corrugations in the surfaces of first and second attenuators 905, 910 help to deflect or redirect the acoustic waves away from the acoustic attenuator 900 prior to reaching the storage devices 120-124 as described above. The corrugations of corrugated sheets 920, 925 include a plurality of peaks 921 and a plurality of troughs 922. Peaks 921 and troughs 922 are parallel to each other and alternate along cardboard sheet 915. Each peak 921 and each trough 922 extends along a first single axis 923. The corrugations of corrugated sheets 935, 940 include a plurality of peaks 936 and a plurality of troughs 937. Peaks 936 and troughs 937 are parallel to each other and alternate along cardboard sheet 930. Each peak 936 and each trough 937 extends along a second single axis 938. First axis 923 is orthogonal to second axis 938, and each is further orthogonal to a third axis 948 extending between first and second attenuators 905, 910. When positioned adjacently to one another to form a 3D structure, the opposite corrugation directions of first and second attenuators 905, 910 help to further scatter, absorb, and trap acoustic waves before they pass through toward the storage devices 120-124.

To allow airflow through attenuator 900, a first set of openings 945 is formed in first attenuator 905, and a second set of openings 950 is formed in second attenuator 910. When positioned next to each other, openings 945 and 950 prevent a direct path or line of sight between a fan on one side and a storage device on the other side. In this manner, acoustic waves emanating from fans 115-117 come into contact with and are attenuated by either or both of first and second attenuators 900, 910. The number, offset pattern, and placement of openings 945, 950 are designed such that a noticeable increase in the total cooling airflow impedance through the system 110 is avoided. The openings 945, 950 are preferable sized and positioned such that an airflow impedance through acoustic attenuator 900 is less than the airflow impedance through the rest of the data storage system 110.

It is also contemplated that in another embodiment, a first attenuator 905 and a second attenuator 910 may be constructed using layers of foam with similar offset openings as those shown in FIG. 9. The separate layers may abut one another or be separated by a distance to allow additional freedom of movement for the cooling air passing through attenuator 900.

Figure 10:
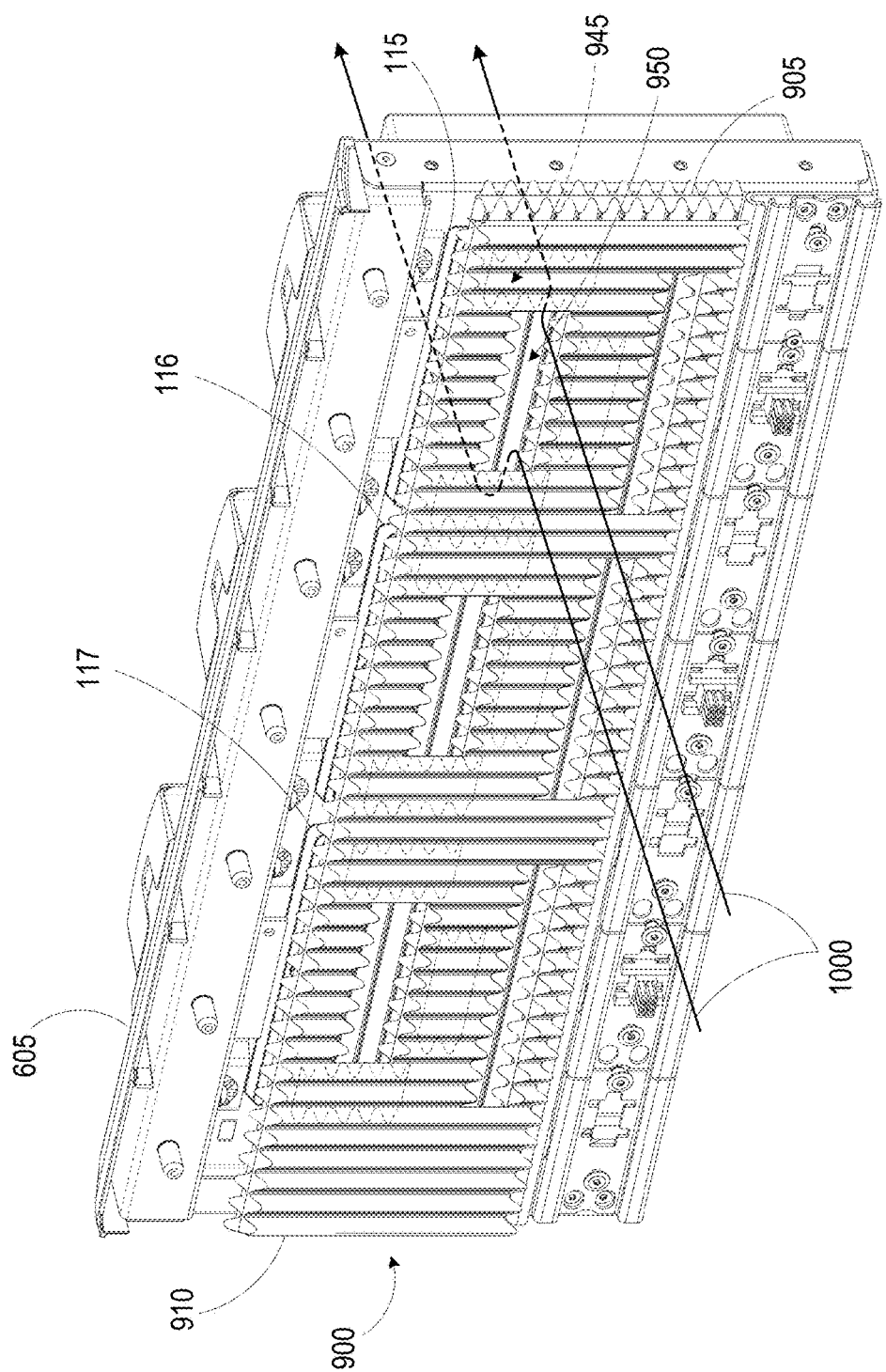
FIG. 10 illustrates an acoustic attenuation device incorporated into an electronics enclosure.

FIG. 10 illustrates a portion of enclosure 113 showing fans 115-117 and acoustic attenuator 900 coupled to bulkhead 605. When fans 115-117 operate, airflow 1000 is directed through system 110 of FIG. 1 and out the back side thereof. Airflow 1000 is required to weave itself through openings 950 and openings 945 in a non-linear fashion to escape the interior of the enclosure 113. Acoustic waves, travelling in the opposite direction, are likewise required to weave themselves through openings 945 and openings 950 to reach the enclosure interior. However, due to the acoustic wave reduction properties of acoustic attenuator 900 as described above, some of the acoustic waves may never reach the storage devices 120-124 while other acoustic waves are significantly reduced in intensity.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above can be combined in various ways to form multiple embodiments. As a result, the invention is not limited to the specific embodiments described above, but only by the claims and their equivalents.

What is claimed is:

1. A data storage system comprising:
a data storage device;
a housing enclosing the data storage device, the housing having a first opening on a first side and a second opening on a second side opposite the first side;
a fan assembly coupled to the housing and configured to draw an airflow through the housing from the first side to the second side; and
an acoustic attenuation device enclosed within the housing between the data storage device and the fan assembly and comprising:
a first corrugated sheet having corrugations formed on a first side of the first corrugated sheet, wherein the corrugations of the first corrugated sheet comprise:
a plurality of peaks, each peak extending along a first direction; and
a plurality of troughs, each trough extending along the first direction; and
a second corrugated sheet separated from the first corrugated sheet along a second direction orthogonal to the first direction, wherein the second corrugated sheet has corrugations formed on a first side of the second corrugated sheet, wherein the corrugations of the second corrugated sheet comprise;
a plurality of peaks, each peak extending along a third direction orthogonal to the first direction and orthogonal to the second direction; and
a plurality of troughs, each trough extending along the third direction:
wherein the first corrugated sheet further has an opening formed therein configured to allow at least a portion of the airflow to pass therethrough from a second side of the first corrugated sheet opposite the first side of the first corrugated sheet; and
wherein the second corrugated sheet further has an opening formed therein configured to allow the at least a portion of the airflow to pass therethrough from the first side of the second corrugated sheet to a second side of the second corrugated sheet opposite the first side of the second corrugated sheet.

2. The data storage system of claim 1, wherein the first and second corrugated sheets comprise die-cut corrugated sheets coupled together to form a three-dimensional structure.

3. The data storage system of claim 2, wherein the opening formed in the first corrugated sheet is offset from the opening formed in the second corrugated sheet in both the first direction and the third direction to cause the airflow to pass through the acoustic attenuation device along a non-linear path.

4. The data storage system of claim 2, wherein the first side of the first corrugated sheet faces the first side of the second corrugated sheet.

5. The data storage system of claim 1, wherein:
the data storage device impedes the airflow through the housing by a first flow impedance value; and
the acoustic attenuation device impedes the airflow through the housing by a second flow impedance value.

6. The data storage system of claim 5, wherein the second flow impedance value differs relative to the first flow impedance value.

7. The data storage system of claim 6, wherein the second flow impedance value is less than the first flow impedance value.

8. An acoustic attenuation device comprising:
a first corrugated sheet having corrugations formed on a first side of the first corrugated sheet, wherein the corrugations of the first corrugated sheet comprise:
a plurality of peaks, each peak extending along a first direction; and
a plurality of troughs, each trough extending along the first direction; and
a second corrugated sheet separated from the first corrugated sheet along a second direction orthogonal to the first direction, wherein the second corrugated sheet has corrugations formed on a first side of the second corrugated sheet, wherein the corrugations of the second corrugated sheet comprise:
a plurality of peaks, each peak extending along a third direction orthogonal to the first direction and orthogonal to the second direction; and
a plurality of troughs, each trough extending along the third direction;
wherein the first corrugated sheet further has an opening formed therein configured to allow at least a portion of airflow to pass therethrough from a second side of the first corrugated sheet opposite the first side of the first corrugated sheet; and
wherein the second corrugated sheet further has an opening formed therein configured to allow the at least a portion of the airflow to pass therethrough from the first side of the second corrugated sheet to a second side of the second corrugated sheet opposite the first side of the second corrugated sheet.

9. The acoustic attenuation device of claim 8, wherein the first and second corrugated sheets comprise die-cut corrugated sheets coupled together to form a three-dimensional structure.

10. The acoustic attenuation device of claim 9, wherein the opening formed in the first corrugated sheet is offset from the opening formed in the second corrugated sheet in both the first direction and the third direction to cause the airflow to pass through the acoustic attenuation device along a non-linear path.

11. The acoustic attenuation device of claim 9, wherein the first side of the first corrugated sheet faces the first side of the second corrugated sheet.

12. The acoustic attenuation device of claim 8, wherein:
the airflow through the housing is impeded by a data storage device by a first flow impedance value; and
the acoustic attenuation device impedes the airflow through the housing by a second flow impedance value.

13. The acoustic attenuation device of claim 12, wherein the second flow impedance value differs relative to the first flow impedance value.

14. The acoustic attenuation device of claim 13, wherein the second flow impedance value is less than the first flow impedance value.

15. An electronics enclosure comprising:
a chassis to hold at least a data storage device, the chassis having a first opening on a first side and a second opening on a second side opposite the first side;
a fan assembly coupled to the chassis and configured to draw an airflow through the chassis from the first side to the second side; and
an attenuation device enclosed within the chassis and comprising:
a first corrugated sheet having corrugations formed on a first side of the first corrugated sheet, wherein the corrugations of the first corrugated sheet comprise:
a plurality of peaks, each peak extending along a first direction; and
a plurality of troughs, each trough extending along the first direction; and
a second corrugated sheet separated from the first corrugated sheet along a second direction orthogonal to the first direction, wherein the second corrugated sheet has corrugations formed on a first side of the second corrugated sheet, wherein the corrugations of the second corrugated sheet comprise:
a plurality of peaks, each peak extending along a third direction orthogonal to the first direction and orthogonal to the second direction; and
a plurality of troughs, each trough extending along the third direction;
wherein the first corrugated sheet further has an opening formed therein configured to allow at least a portion of the airflow to pass therethrough from a second side of the first corrugated sheet opposite the first side of the first corrugated sheet; and
wherein the second corrugated sheet further has an opening formed therein configured to allow the at least a portion of the airflow to pass therethrough from the first side of the second corrugated sheet to a second side of the second corrugated sheet opposite the first side of the second corrugated sheet.

16. The electronics enclosure of claim 15, wherein the first and second corrugated sheets comprise die-cut corrugated sheets coupled together to form a three-dimensional structure.

17. The electronics enclosure of claim 16, wherein the opening formed in the first corrugated sheet is offset from the opening formed in the second corrugated sheet in both the first direction and the third direction to cause the airflow to pass through the acoustic attenuation device along a non-linear path.

18. The electronics enclosure of claim 16, wherein the first side of the first corrugated sheet faces the first side of the second corrugated sheet.

19. The electronics enclosure of claim 15, wherein:
the airflow is impeded by a first flow impedance value; and
the attenuation device impedes the airflow through the housing by a second flow impedance value.

20. The electronics enclosure device of claim 19, wherein the second flow impedance value differs relative to the first flow impedance value.

* * * * *